(12) United States Patent  
Nishibe et al.

(10) Patent No.: US 10,593,609 B2  
(45) Date of Patent: Mar. 17, 2020

(54) SEMICONDUCTOR DEVICE AND POWER CONVERTER

(71) Applicant: TOYOTA JIDOSHA KABUSHIKI KAISHA, Toyota-shi, Aichi-ken (JP)

(72) Inventors: Yuji Nishibe, Nagakute (JP); Yasuyuki Kageyama, Nagakute (JP); Yasuyoshi Saito, Nagakute (JP); Shinichi Miura, Toyota (JP); Yasuhide Yagyu, Nagakute (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/944,033

(22) Filed: Apr. 3, 2018

(65) Prior Publication Data

US 2018/0286774 A1 Oct. 4, 2018

(30) Foreign Application Priority Data

Apr. 4, 2017 (JP) ................. 2017-074822

(51) Int. Cl.
*H01L 23/31* (2006.01)
*H02M 7/537* (2006.01)
(Continued)

(52) U.S. Cl.
CPC .......... *H01L 23/3107* (2013.01); *H01L 23/02* (2013.01); *H01L 23/42* (2013.01);
(Continued)

(58) Field of Classification Search
CPC ............... H01L 23/4822; H01L 23/50; H01L 23/49838; H01L 23/528; H01L 23/5386; H01L 23/49541; H01L 23/49548; H01L 23/49555; H01L 23/49861; H01L 23/52; H01L 23/5283; H01L 2225/06579; H01L 23/047; H01L 23/045; H01L 23/049; H01L 23/055; H01L 23/057; H01L 23/5286; H01L 23/49524; H01L 23/49811;
(Continued)

(56) References Cited

U.S. PATENT DOCUMENTS 4,949,455 A * 8/1990 Nakamura .......... H01L 21/4885  
205/122  
7,880,283 B2 * 2/2011 Zhuang .................. H01L 24/34  
257/177

(Continued)

FOREIGN PATENT DOCUMENTS

JP 2000-223812 A 8/2000  
JP 2013-106503 A 5/2013  
JP 2015-095963 A 5/2015

*Primary Examiner* — David A Zarneke  
(74) *Attorney, Agent, or Firm* — Sughrue Mion, PLLC

(57) ABSTRACT

A semiconductor device includes: at least one power semiconductor element; a sealing resin disposed so as to seal the power semiconductor element; and a plurality of electrical terminals each electrically connected to the power semiconductor element and each including a protrusion protruding from a surface of the sealing resin. The protrusion includes a first part that is provided on a side of the sealing resin in a protrusion direction of the protrusion and of which a cross-section intersecting the protrusion direction has one of a circular shape and an oval shape.

5 Claims, 14 Drawing Sheets

(51) Int. Cl.

| | | |
|---|---|---|
| *H01L 23/02* | (2006.01) | |
| *H01L 23/42* | (2006.01) | |
| *H02M 7/00* | (2006.01) | |
| *H01L 23/46* | (2006.01) | |
| *H01L 23/373* | (2006.01) | |
| *H01L 23/433* | (2006.01) | |
| *H01L 23/482* | (2006.01) | |
| *H01L 23/00* | (2006.01) | |
| *H01L 21/48* | (2006.01) | |
| *H01L 23/498* | (2006.01) | |

(52) U.S. Cl.
CPC ............ *H01L 23/46* (2013.01); *H02M 7/003* (2013.01); *H02M 7/537* (2013.01); *H01L 21/4885* (2013.01); *H01L 23/3736* (2013.01); *H01L 23/4334* (2013.01); *H01L 23/4822* (2013.01); *H01L 23/49811* (2013.01); *H01L 23/49838* (2013.01); *H01L 24/20* (2013.01); *H01L 24/34* (2013.01); *H01L 24/36* (2013.01); *H01L 24/65* (2013.01); *H01L 2224/33* (2013.01); *H01L 2924/181* (2013.01)

(58) Field of Classification Search
CPC ........... H01L 21/4885; H01L 23/48911; H01L 23/48938; H01L 24/20; H01L 24/34; H01L 24/36; H01L 24/65; H02M 7/003
See application file for complete search history.

(56) References Cited

U.S. PATENT DOCUMENTS

| | | | |
|---|---|---|---|
| 8,502,385 B2* | 8/2013 | Oka | ............... H01L 21/56 257/170 |
| 9,198,332 B2* | 11/2015 | Osada | ............... H05K 7/20927 |
| 10,096,572 B2* | 10/2018 | Shimakawa | ............ H01L 25/07 |
| 2016/0365296 A1* | 12/2016 | Otremba | ............... H01L 23/295 |
| 2017/0077020 A1* | 3/2017 | Mabuchi | ........... H01L 23/49838 |
| 2017/0179108 A1* | 6/2017 | Okuda | ............... H01L 29/7395 |

* cited by examiner

FIG. 14
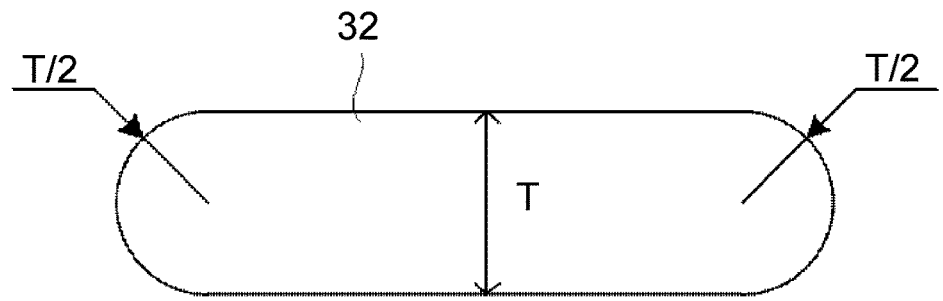
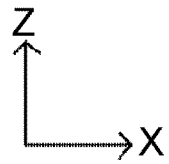
FIG. 15
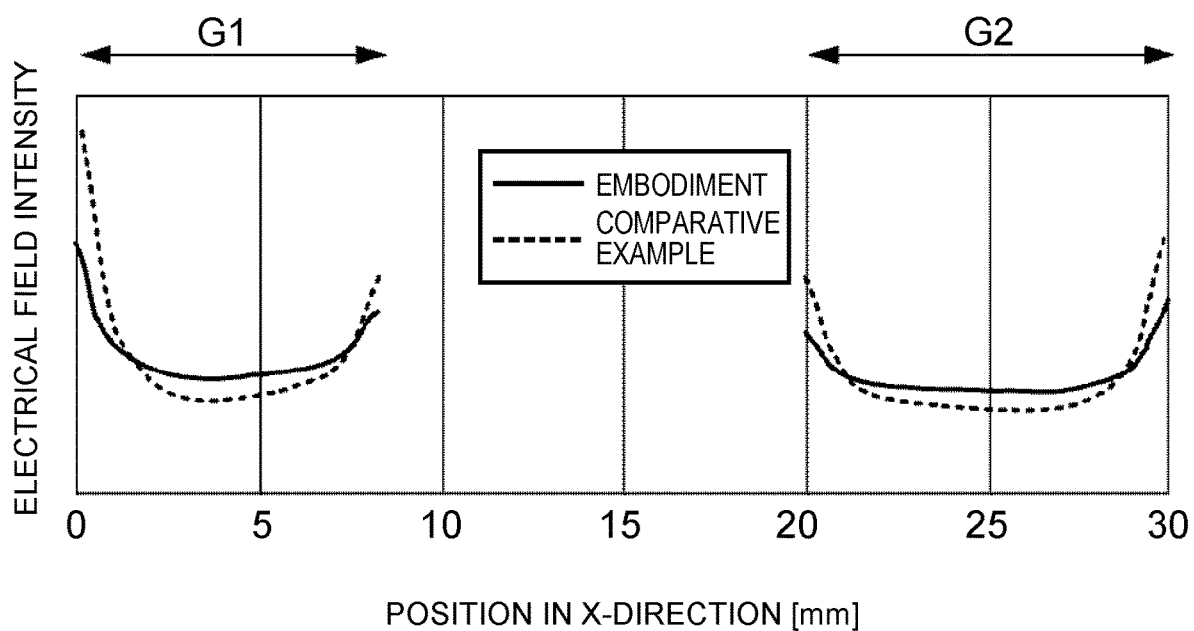

SEMICONDUCTOR DEVICE AND POWER CONVERTER

INCORPORATION BY REFERENCE

The disclosure of Japanese Patent Application No. 2017-074822 filed on Apr. 4, 2017 including the specification, drawings and abstract is incorporated herein by reference in its entirety.

BACKGROUND

1. Technical Field

The present disclosure relates to a semiconductor device and a power converter.

2. Description of Related Art

Examples of known techniques relating to a power module having a power semiconductor include the following. One example is Japanese Patent Application Publication No. 2013-106503 that describes an inverter including a plurality of power modules, in which a Y-capacitor formed by grounding series-connected two capacitors at a connection point is used as noise bypass means.

Another example is Japanese Patent Application Publication No. 2015-095963 that describes a technique relating to a flat plate-shaped busbar used for a power converter including upper-arm and lower-arm switching elements that are encapsulated in a resin to form a module. This busbar has a P-electrode and an N-electrode disposed so as to at least partially overlap each other in a thickness direction, with an insulation layer sandwiched therebetween, and a snubber circuit formed by a surface-mounted capacitive element is electrically connected between the P-electrode and the N-electrode.

SUMMARY

Thanks to improvements in power device performance and advances in mounting techniques and cooling techniques, power modules having a power semiconductor are evolving toward higher power density and smaller size. This trend has brought to the surface the impact of securing a creepage distance for securing insulation performance of semiconductors that have been hitherto masked due to size restrictions for thermal design reasons. If power modules are to be further downsized henceforth, the insulation distance between electrical terminals that generate high voltages would need to be reduced.

In the case of a power device operating at high speed, a high surge voltage is caused by parasitic inductance of a wire, which makes insulation design more difficult. Since the insulation performance of a power module is determined by creeping discharge, it is necessary to secure an insulation distance between electrical terminals. However, doing so would increase the size of the power module.

The present disclosure relates to suppress creeping discharge occurring between electrical terminals.

As an example aspect of the present disclosure is a semiconductor device. The semiconductor device includes: at least one power semiconductor element; a sealing resin disposed so as to seal the power semiconductor element; and a plurality of electrical terminals each electrically connected to the power semiconductor element and each including a protrusion protruding from a surface of the sealing resin. The protrusion includes a first part that is provided on a side of the sealing resin in a protrusion direction of the protrusion and of which a cross-section intersecting the protrusion direction has one of a circular shape and an oval shape.

The protrusion may include a second part having a flat plate shape, and the second part is provided on a side of a leading end in the protrusion direction; and an area of a cross-section of the first part intersecting the protrusion direction and an area of a cross-section of the second part intersecting the protrusion direction may be equal.

End surfaces of the first part in a terminal array direction in which the electrical terminals may be arrayed are curved surfaces having a curvature corresponding to the reciprocal of half a length of the first part in a direction intersecting the terminal array direction.

The power semiconductor elements may include a first transistor and a second transistor, the electrical terminals may include a first electrical terminal connected to a collector of the first transistor, a second electrical terminal connected to an emitter of the second transistor, and a third electrical terminal connected to an emitter of the first transistor and a collector of the second transistor.

As an example aspect of the present disclosure is a power converter. The power converter includes a plurality of semiconductor devices stacked with a cooler sandwiched in between. Each of the semiconductor devices includes at least one power semiconductor element, a sealing resin disposed so as to seal the power semiconductor element, and a plurality of electrical terminals each electrically connected to the power semiconductor element and each having a protrusion protruding from a surface of the sealing resin. The protrusion includes a first part that is provided on a side of the sealing resin in a protrusion direction of the protrusion and of which a cross-section intersecting the protrusion direction has one of a circular shape and an oval shape, and a second part that has a flat plate shape and is provided on a side of a leading end in the protrusion direction.

The present disclosure can suppress creeping discharge occurring between electrical terminals.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 14 is a sectional view taken along line XIV-XIV in FIG. 13; and

FIG. 15 is a graph showing an electrical field distribution between electrical terminals in the power module according to the embodiment of the present disclosure and in the power module according to the comparative example.

DETAILED DESCRIPTION OF EMBODIMENTS

Figure 1:
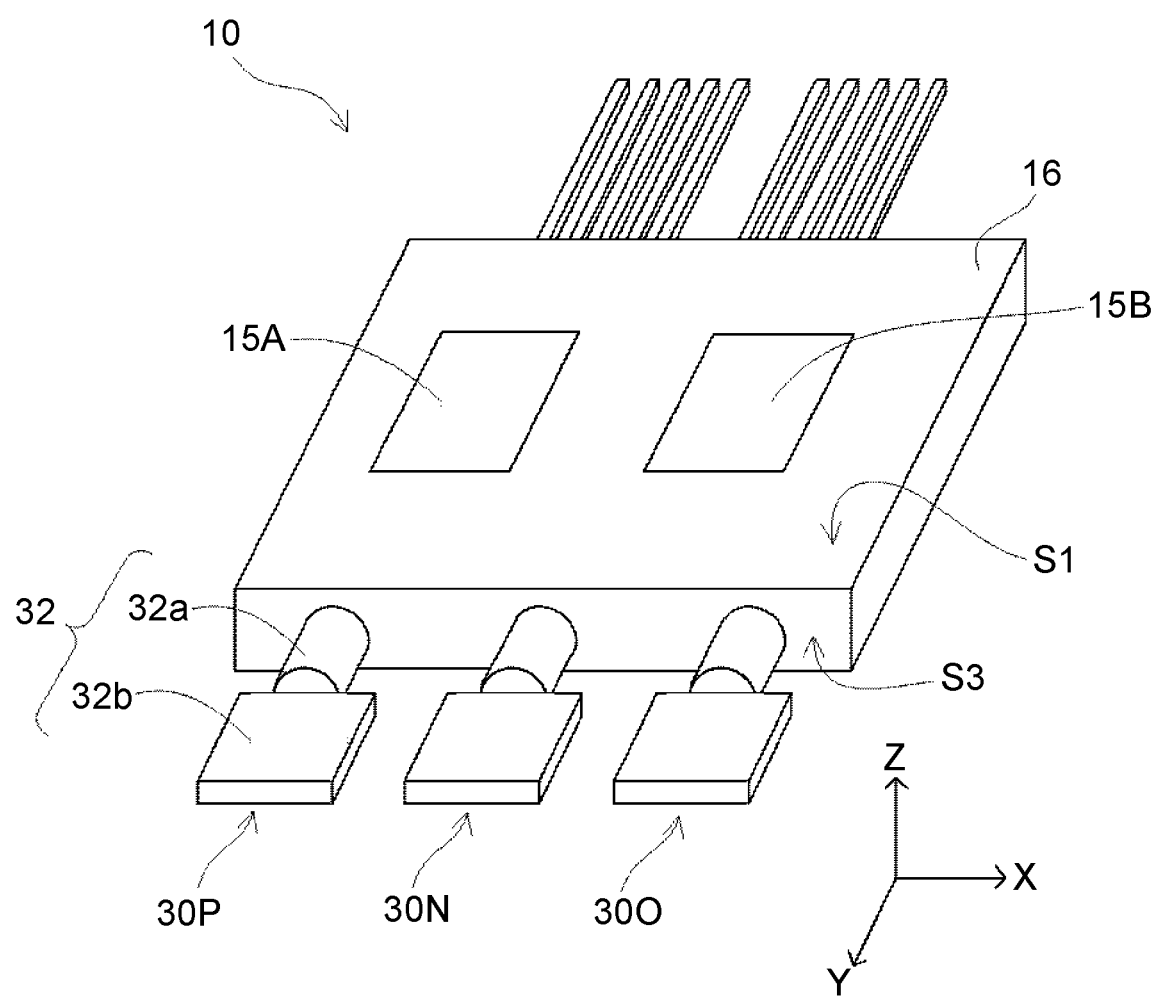
FIG. 1 is a perspective view showing the configuration of a power module according to an embodiment of the present disclosure.

Embodiments of the present disclosure will be described below with reference to the drawings. Those components or parts in the drawings that are substantially the same or equivalent are denoted by the same reference signs.

Figure 2:
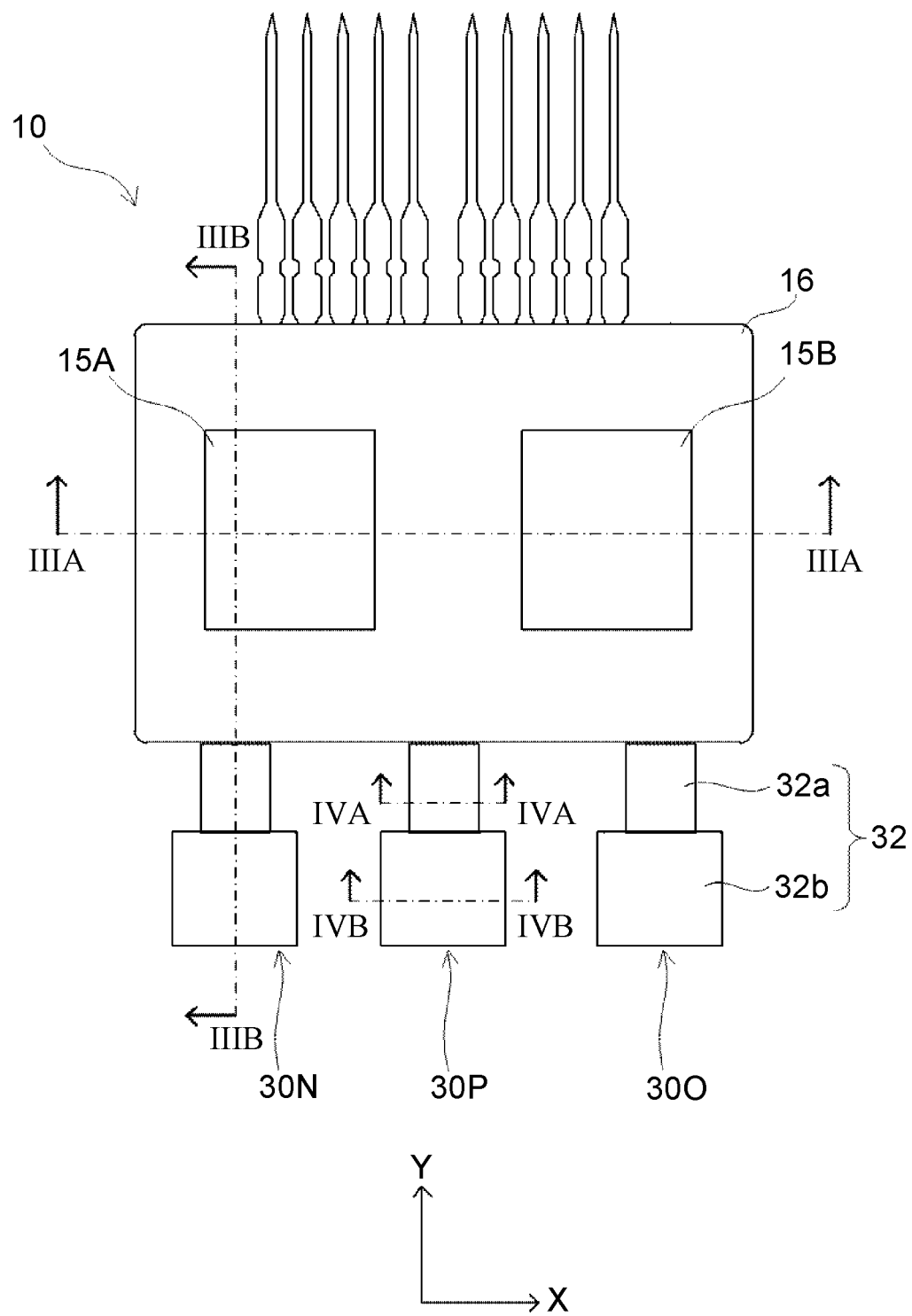
FIG. 2 is a plan view of the power module according to the embodiment of the present disclosure.
Figure 3A:
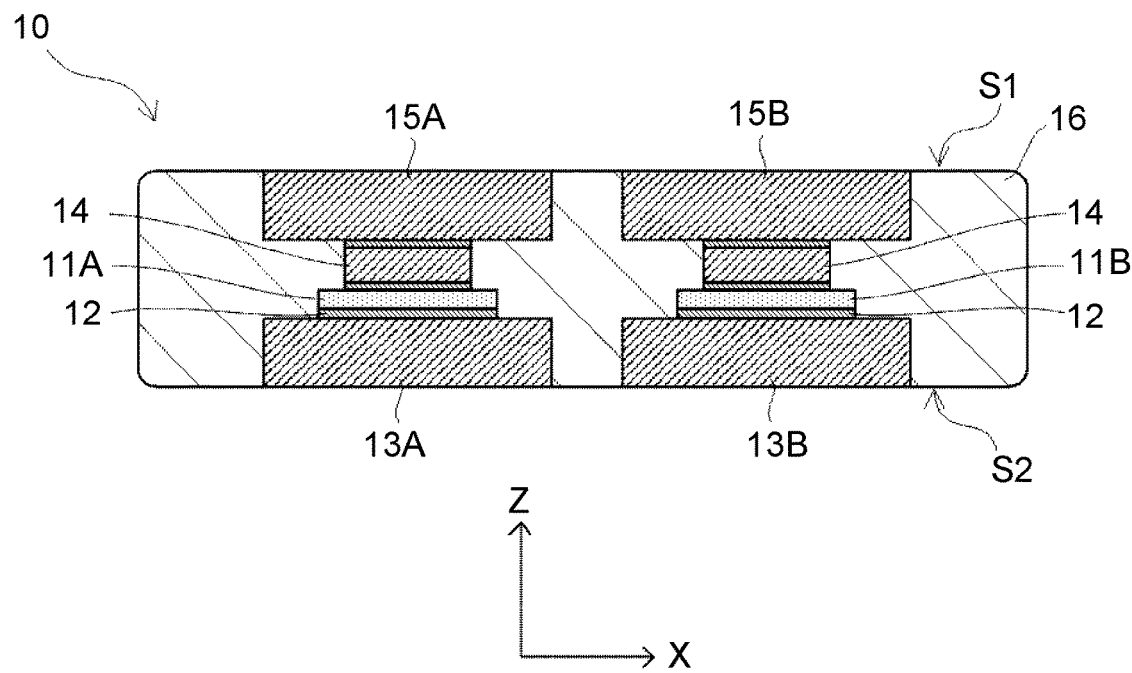
FIG. 3A is a sectional view taken along line IIIA-IIIA in FIG. 2.
Figure 3B:
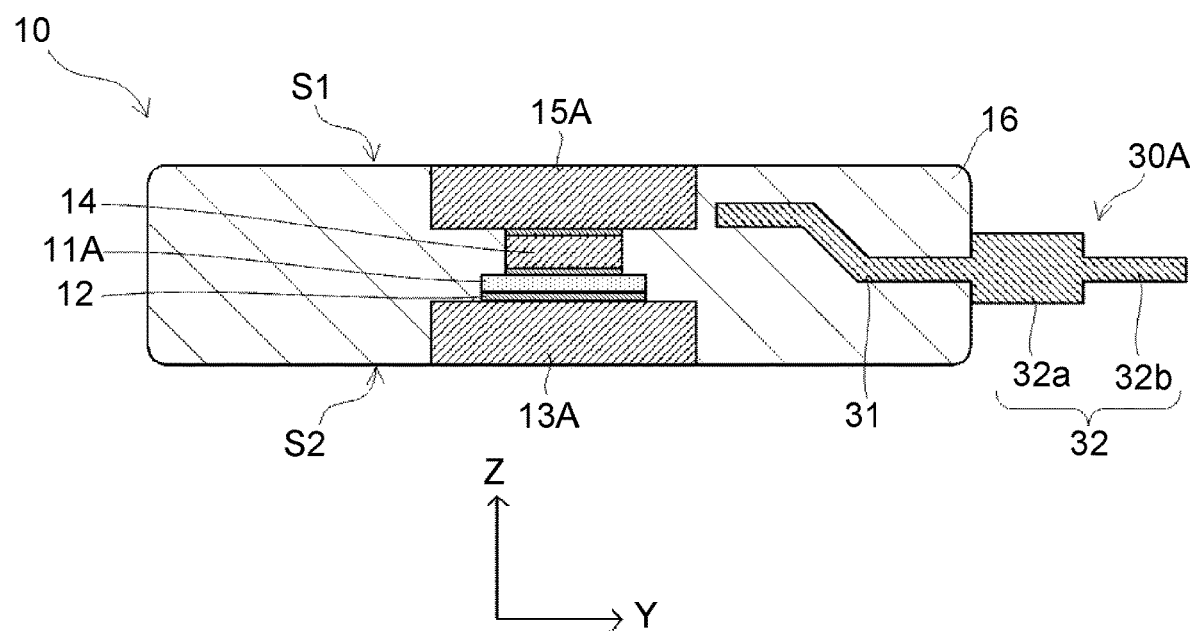
FIG. 3B is a sectional view taken along line IIIB-IIIB in FIG. 2.
Figure 4A:
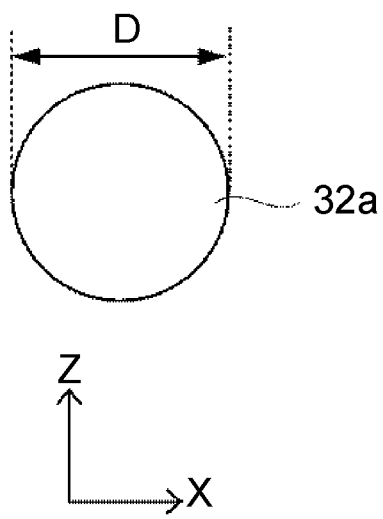
FIG. 4A is a sectional view taken along line IVA-IVA in FIG. 2.
Figure 4B:
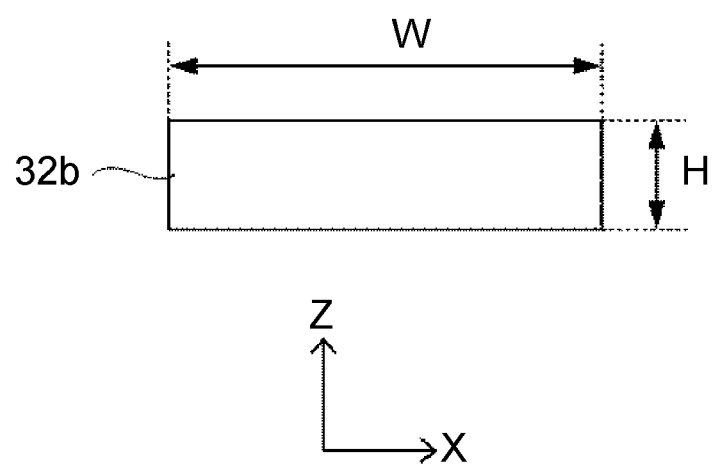
FIG. 4B is a sectional view taken along line IVB-IVB in FIG. 2.
Figure 5:
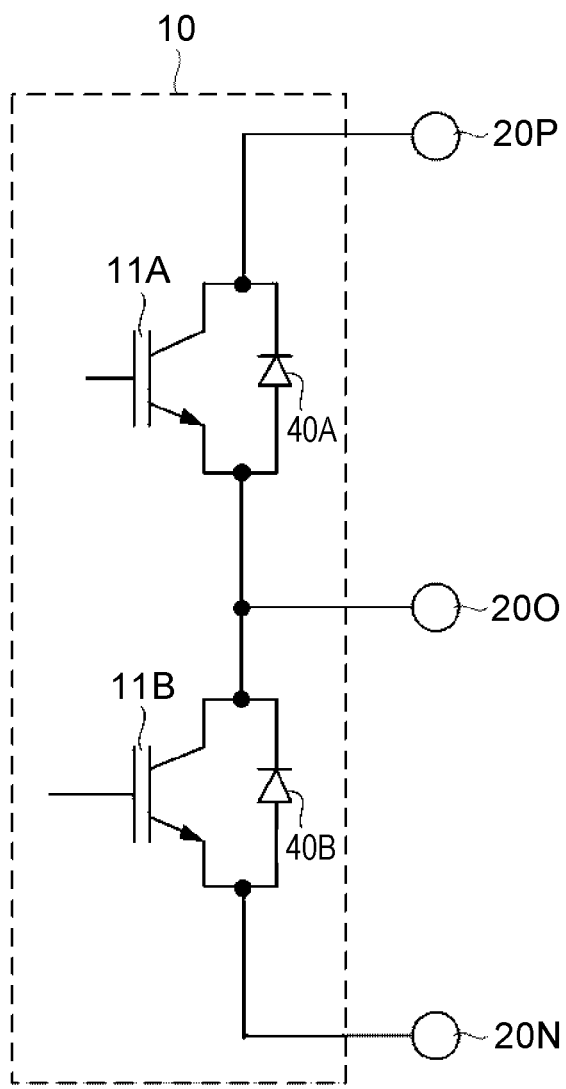
FIG. 5 is an equivalent circuit diagram showing the configuration of the power module of the present disclosure.

FIG. 1 is a perspective view showing the configuration of a power module 10 as a semiconductor device according to a first embodiment of the present disclosure. FIG. 2 is a plan view of the power module 10. FIG. 3A is a sectional view taken along line IIIA-IIIA in FIG. 2, and FIG. 3B is a sectional view taken along line IIIB-IIIB in FIG. 2. FIG. 4A is a sectional view taken along line IVA-IVA in FIG. 2, and FIG. 4B is a sectional view taken along line IVB-IVB in FIG. 2. FIG. 5 is an equivalent circuit diagram of the power module 10.

As shown in FIG. 3A and FIG. 5, the power module 10 includes series-connected two power semiconductor elements 11A, 11B. The power semiconductor elements 11A, 11B are power devices such as insulated gate bipolar transistors (IGBTs). However, the power semiconductor elements 11A, 11B may be power devices other than IGBTs, such as metal-oxide-semiconductor field effect transistors (MOSFETs) or bipolar transistors. As shown in FIG. 5, the power module 10 has a P-terminal 20P connected to a collector of the power semiconductor element 11A, an N-terminal 20N connected to an emitter of the power semiconductor element 11B, and an O-terminal 20O connected to an emitter of the power semiconductor element 11A and a collector of the power semiconductor element 11B. Diodes 40A, 40B are respectively connected between the emitter and the collector of the power semiconductor element 11A and between those of the power semiconductor element 11B.

As shown in FIG. 3A, heatsinks 13A, 13B are respectively joined to one side of the power semiconductor elements 11A, 11B through solders 12. Heatsinks 15A, 15B are respectively joined to the other side of the power semiconductor elements 11A, 11B through spacers 14. The heatsinks 13A, 13B, 15A, 15B and the spacers 14 are each made of a material having relatively high thermal conductivity, such as Cu. Thus, the power module 10 according to this embodiment is a double-sided cooling power module that has a heat release path on both sides of the power semiconductor elements 11A, 11B.

The power semiconductor elements 11A, 11B, the heatsinks 13A, 13B, 15A, 15B, and the spacers 14 are sealed with a mold resin 16 and embedded inside the mold resin 16. For example, the mold resin 16 may be an epoxy resin. However, the mold resin 16 is merely an example of the sealing resin, and the sealing resin is not limited to this aspect. Surfaces of the heatsinks 15A, 15B are exposed from a surface S1 of the mold resin 16. Similarly, surfaces of the heatsinks 13A, 13B are exposed from a surface S2 of the mold resin 16. In this embodiment, the heatsink 15A is electrically connected to the O-terminal 20O, and the heatsink 15B is electrically connected to the N-terminal 20N. The heatsink 13A is electrically connected to the P-terminal 20P, and the heatsink 13B is electrically connected to the O-terminal 20O.

The power module 10 has electrical terminals 30P, 30N, 30O that are electrically connected to at least one of the power semiconductor elements 11A, 11B. The electrical terminals 30P, 30N, 30O constitute the P-terminal 20P, the N-terminal 20N, and the O-terminal 20O, respectively.

As shown in FIG. 1, FIG. 2, and FIG. 3B, the electrical terminals 30P, 30N, 30O each have a section 31 that is embedded inside the mold resin 16 and a protruding section 32 that protrudes from a surface S3 of the mold resin 16. The electrical terminals 30P, 30N, 30O are provided at intervals along a direction (X-direction) orthogonal to a protrusion direction of the protruding section 32 (Y-direction).

The protruding sections 32 of the electrical terminals 30P, 30N, 30O each have a first part 32a provided on the side of the mold resin 16 (base side) and a second part 32b provided on the side of a leading end in the protrusion direction of the protruding section 32 (Y-direction). The first part 32a and the second part 32b of the protruding section 32 are different in shape from each other. In this embodiment, the first part 32a of the protruding section 32 has a columnar shape. Thus, a cross-section of the first part 32a of the protruding section 32 orthogonal to the protrusion direction (Y-direction) (a cross-section thereof parallel to an X-Z plane) has a circular shape as shown in FIG. 4A. On the other hand, the second part 32b of the protruding section 32 has a shape of a flat plate with flat surfaces parallel to an X-Y plane, and a cross-section of the second part 32b of the protruding section 32 orthogonal to the protrusion direction (Y-direction) (a cross-section thereof parallel to the X-Z plane) has a rectangular shape as shown in FIG. 4B. In this embodiment, the planar shape of the second part 32b of the protruding section 32 in the X-Y plane is rectangular as shown in FIG. 2. However, the second part 32b is not limited to this aspect, and may have an arbitrary shape. Moreover, the direction of the flat surfaces of the second part 32b of the protruding section 32 may be turned an arbitrary angle around an axis (Y-axis) parallel to the protrusion direction of the protruding section 32 as a turning axis.

The area of the cross-section of the first part 32a of the protruding section 32 orthogonal to the protrusion direction (the cross-section thereof parallel to the X-Z plane) and the area of the cross-section of the second part 32b of the protruding section 32 orthogonal to the protrusion direction (the cross-section thereof parallel to the X-Z plane) are equal. Specifically, when the diameter of the circle shown in FIG. 4A is D, and the width and the height of the rectangle shown in FIG. 4B are W and H, respectively, the following Formula (1) is satisfied.

$$\pi \times (D/2)2 = W \times H \qquad (1)$$

The purpose of thus setting the cross-sectional areas to be equal is to define a minimum required cross-sectional area to reduce a loss occurring when passing a high current through the electrical terminal. Increasing this minimum cross-sectional area would result in undesirable increases in weight and size.

Figure 6:
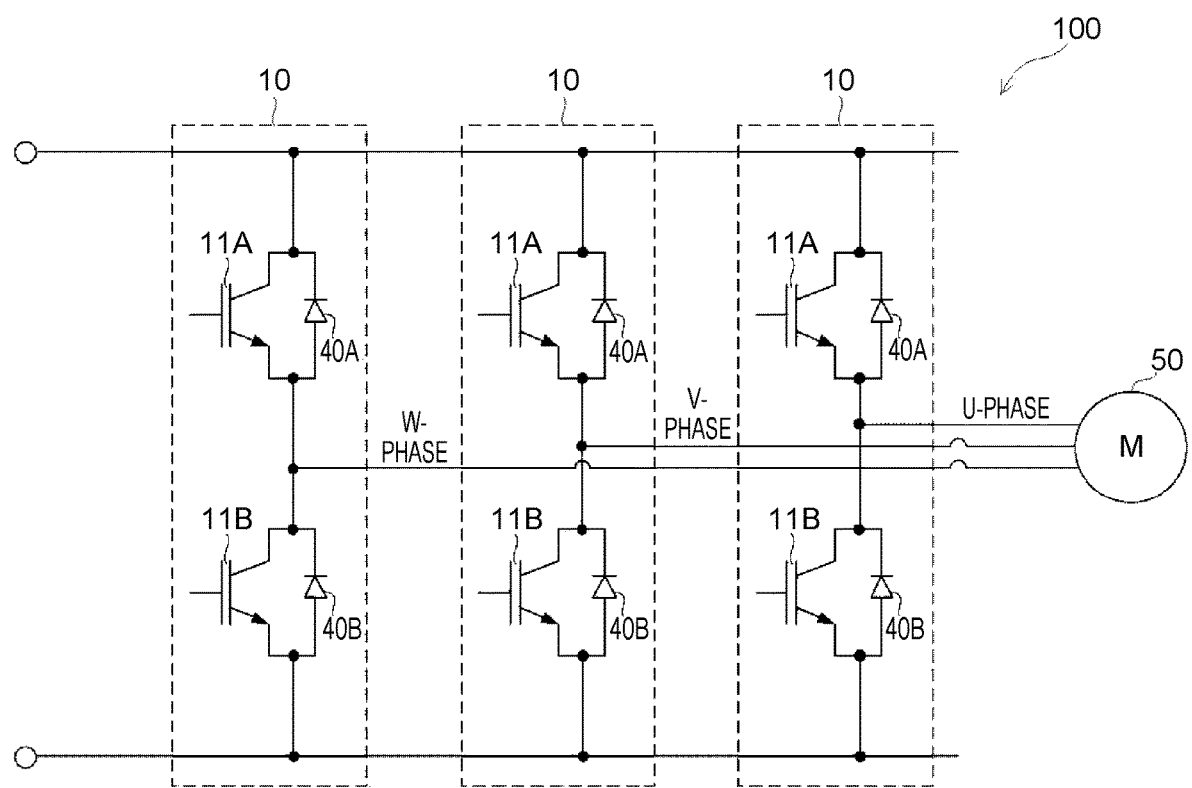
FIG. 6 is a circuit diagram showing the configuration of an inverter according to an embodiment of the present disclosure.

FIG. 6 is a circuit diagram showing the configuration of an inverter 100 as a power converter according to an embodiment of the present disclosure that is formed by combining three power modules 10. The inverter 100 changes direct-current power into three-phase alternating-current power to drive a motor 50. The three power modules 10 composing the inverter 100 respectively correspond to a U-phase, a V-phase, and a W-phase of three-phase alternating-current power. The power semiconductor elements 11A, 11B of each power module 10 respectively function as an upper-arm switch and a lower-arm switch of each phase. The motor 50 is driven by the power semiconductor elements 11A, 11B of each phase turning on and off at predetermined timings.

Figure 7:
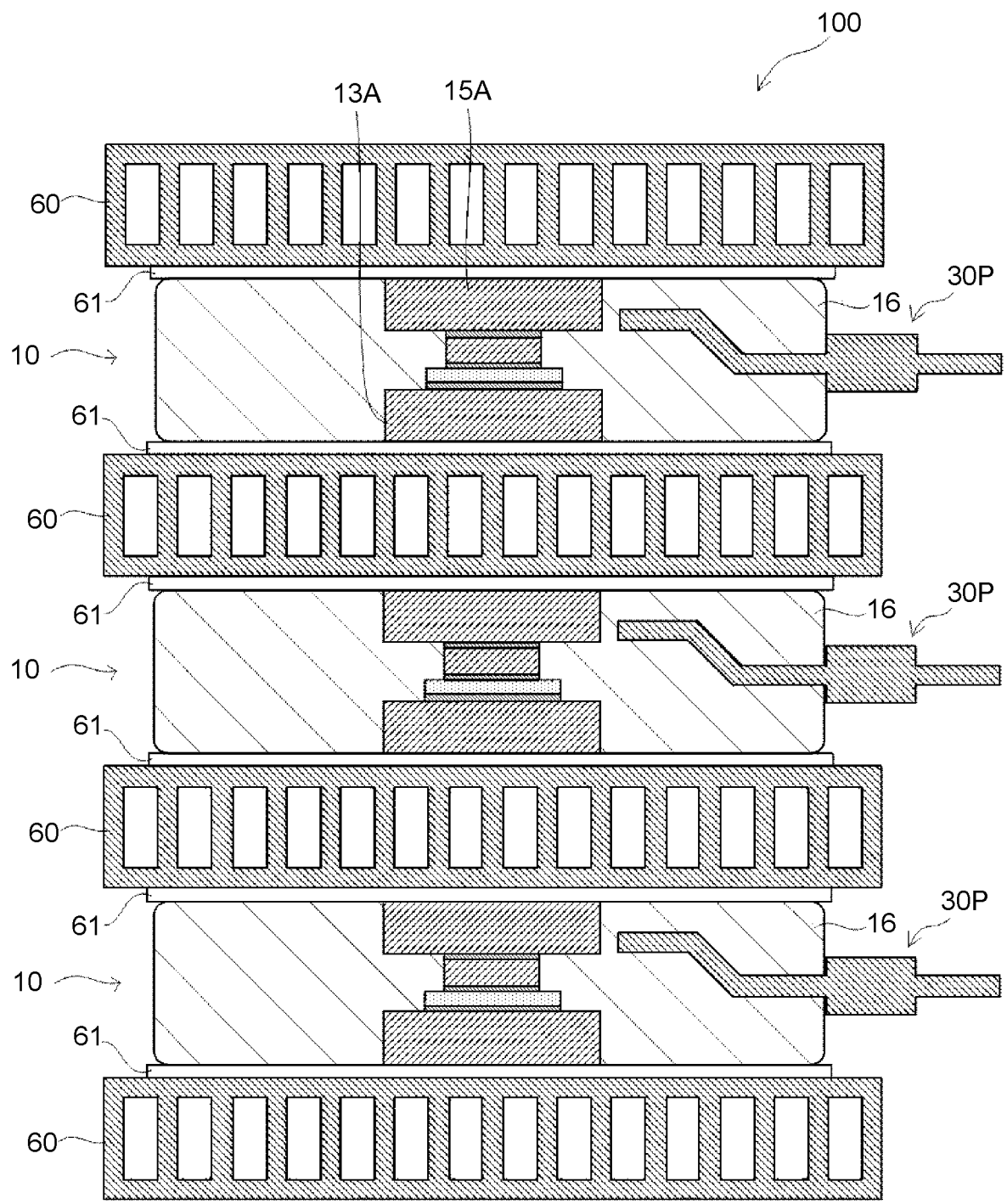
FIG. 7 is a sectional view of the inverter according to the embodiment of the present disclosure.

FIG. 7 is a sectional view of the inverter 100 including the three power modules 10. The three power modules 10 are stacked with a cooler 60 sandwiched in between. Specifically, the coolers 60 and the power modules 10 are alternately stacked, with the cooler 60 joined to both sides of each power module 10. The cooler 60 is made of metal, such as Al. The cooling method of the cooler 60 may be either an air cooling method or a water cooling method. An insulating plate 61 made of ceramic, such as SiN, is provided between each cooler 60 and each power module 10, so that the heatsinks 13A, 13B, 15A, 15B exposed from the surfaces of the mold resin 16 and the coolers 60 are insulated from each other.

Figure 8:
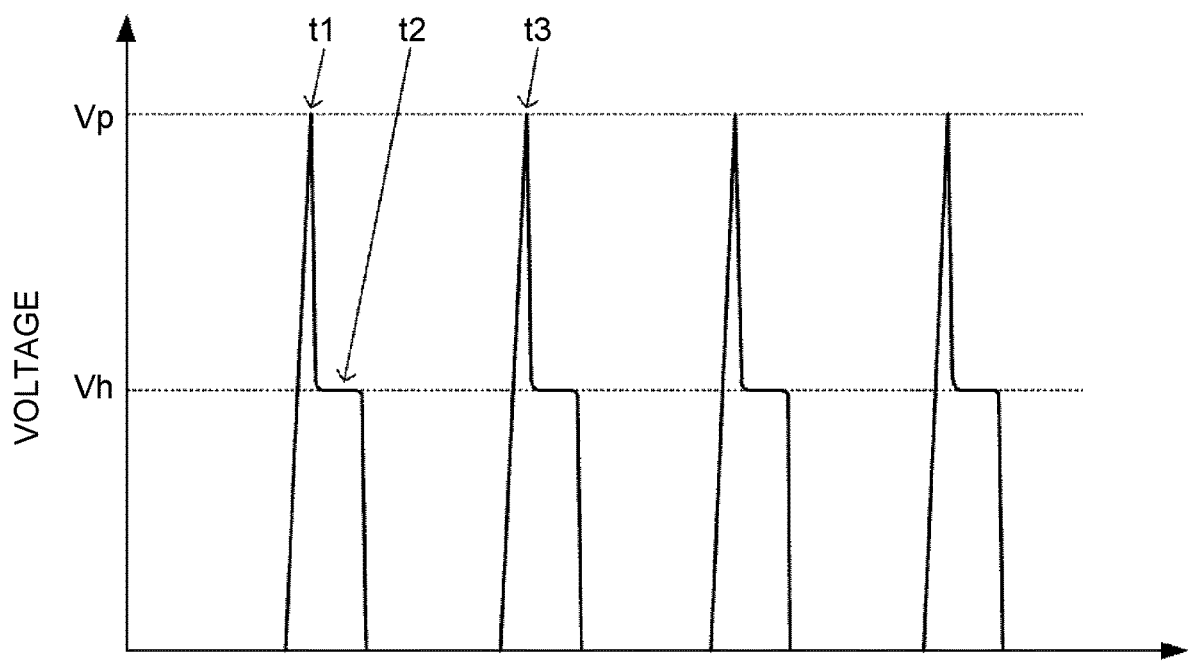
FIG. 8 is a view showing a waveform of voltage surges occurring between electrical terminals of the power module according to the embodiment of the present disclosure.
Figure 9A:
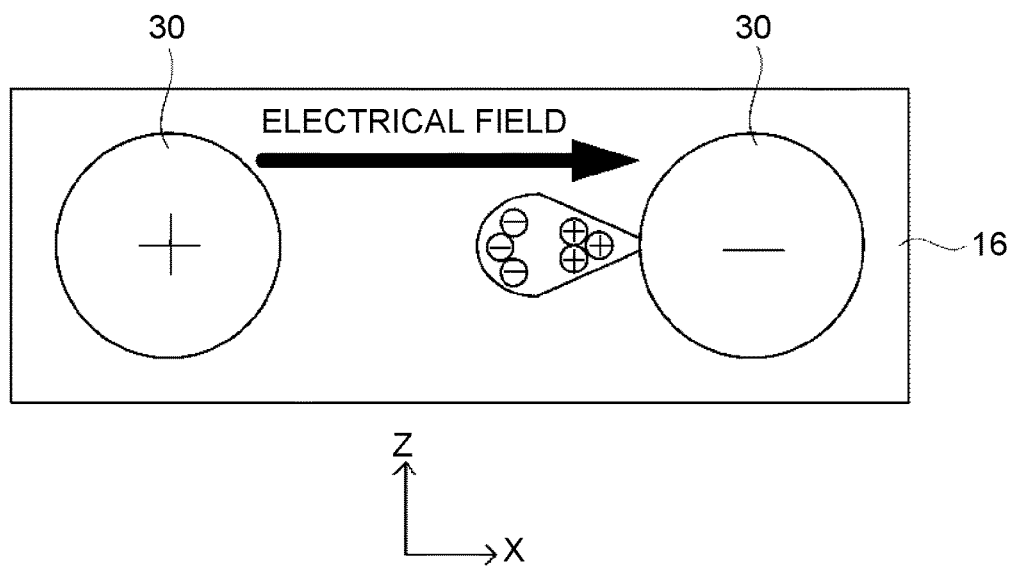
FIG. 9A is a view showing a phenomenon occurring between the electrical terminals of the power module according to the embodiment of the present disclosure at one time point in the waveform of voltage surges occurring between the electrical terminals.
Figure 9B:
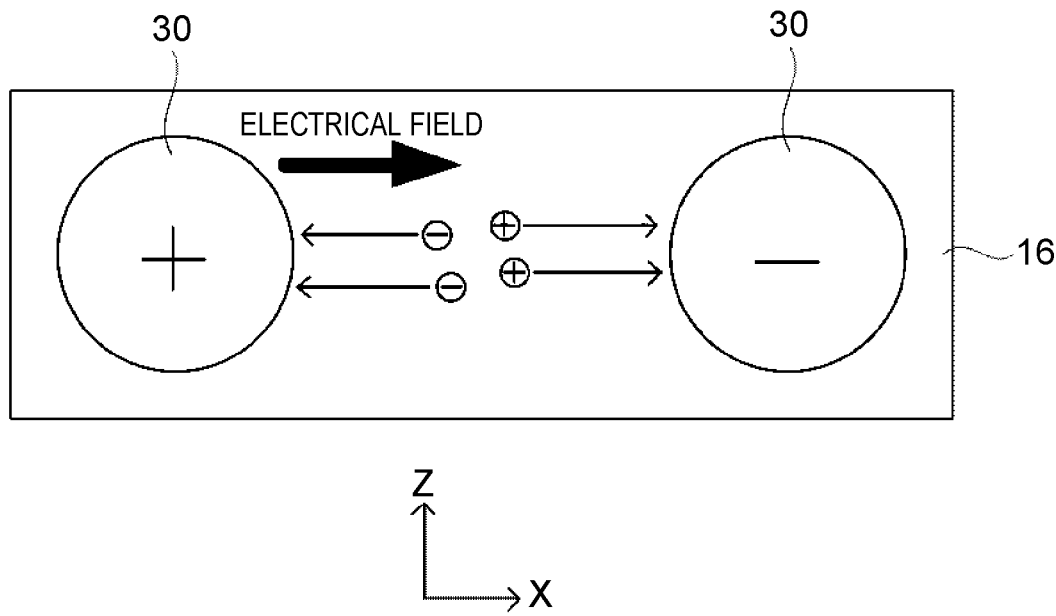
FIG. 9B is a view showing a phenomenon occurring between the electrical terminals of the power module according to the embodiment of the present disclosure at one time point in the waveform of voltage surges occurring between the electrical terminals.
Figure 9C:
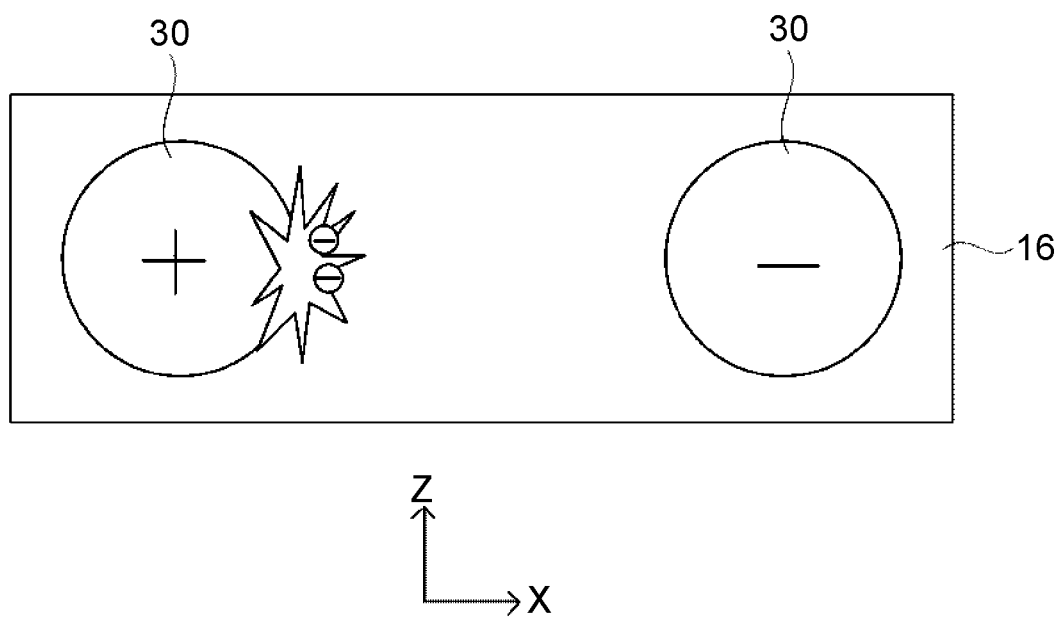
FIG. 9C is a view showing a phenomenon occurring between the electrical terminals of the power module according to the embodiment of the present disclosure at one time point in the waveform of voltage surges occurring between the electrical terminals.

The mechanism of how discharge along a surface of a mold resin, i.e., creeping discharge, occurs between electrical terminals of a power module will be described below. In the case where the inverter shown in FIG. 6 is formed using a plurality of power modules and these power modules are operated, surge voltages of the waveform as shown in FIG. 8 occur between the electrical terminals of the power modules. FIG. 9A, FIG. 9B, and FIG. 9C are views showing phenomena occurring between the electrical terminals at the respective time points shown in FIG. 8. FIG. 9A to FIG. 9C illustrate a model case where the protruding section of the electrical terminal 30 protruding from the mold resin 16 has a columnar shape.

At time t1 in the waveform of surge voltages at which a peak voltage Vp occurs between the electrical terminals 30, the electrical field near a surface of the electrical terminal 30 becomes most intense, resulting in partial discharge near the surface of the electrical terminal 30 (generation of initial charges) (FIG. 9A).

After the occurrence of the peak voltage Vp, at time t2 at which a hold voltage Vh with a constant voltage level occurs, released charges resulting from the partial discharge start to move and reach near the opposite electrical terminal 30. These charges are called heterocharges. The heterocharges are charges that are present near the opposite electrical terminal 30 and have a reverse polarity from the polarity of the electrical terminal 30. Concentration of electrical field occurs between the heterocharges and the electrical terminal 30 (FIG. 9B).

Thereafter, at time t3 at which the next peak voltage Vp in the waveform of surge voltages occurs between the electrical terminals 30, further concentration of electrical field occurs, which leads to avalanche discharge and eventually to insulation breakdown (FIG. 9C).

It can be seen that, according to this mechanism of the occurrence of creeping discharge, partial discharge is a starting point of spark discharge that leads to insulation breakdown. Therefore, if partial discharge is suppressed, creeping discharge can be suppressed, which would improve the insulation performance between the electrical terminals.

Figure 10:
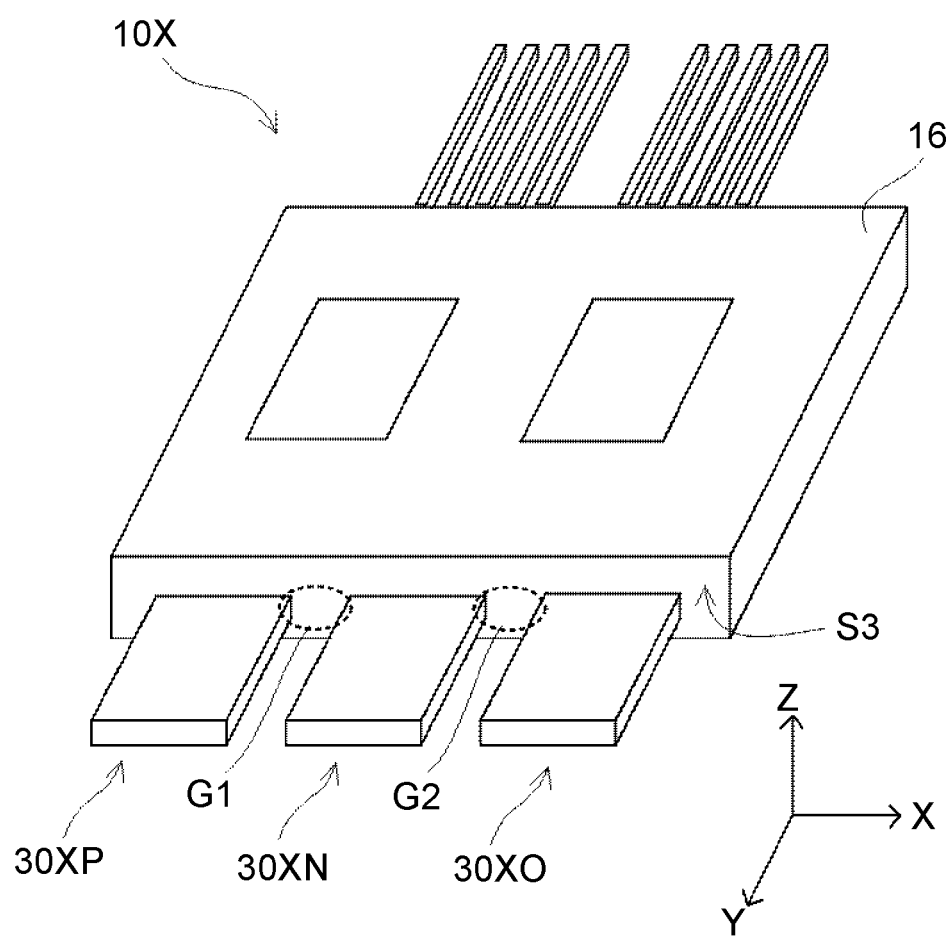
FIG. 10 is a perspective view showing the configuration of a power module according to a comparative example.

FIG. 10 is a perspective view showing the configuration of a power module 10X according to a comparative example. In the power module 10X according to the comparative example, the shapes of electrical terminals 30XP, 30XN, 30XO are different from the shapes of the electrical terminals of the power module 10 according to the embodiment. Specifically, the protruding sections 32 of the electrical terminals 30XP, 30XN, 30XO of the power module 10X according to the comparative example, protruding from the surface S3 of the mold resin 16, have a simple shape of a rectangular parallelepiped flat plate. When the protruding sections 32 of the electrical terminals 30XP, 30XN, 30XO thus have a simple rectangular parallelepiped shape, concentration of electrical field tends to occur at the corners of the electrical terminals 30XP, 30XN, 30XO, and creeping discharge along the surface of the mold resin 16 tends to occur in a region G1 between the electrical terminals 30XP, 30XN or in a region G2 between the electrical terminals 30XN, 30XO.

Figure 11:
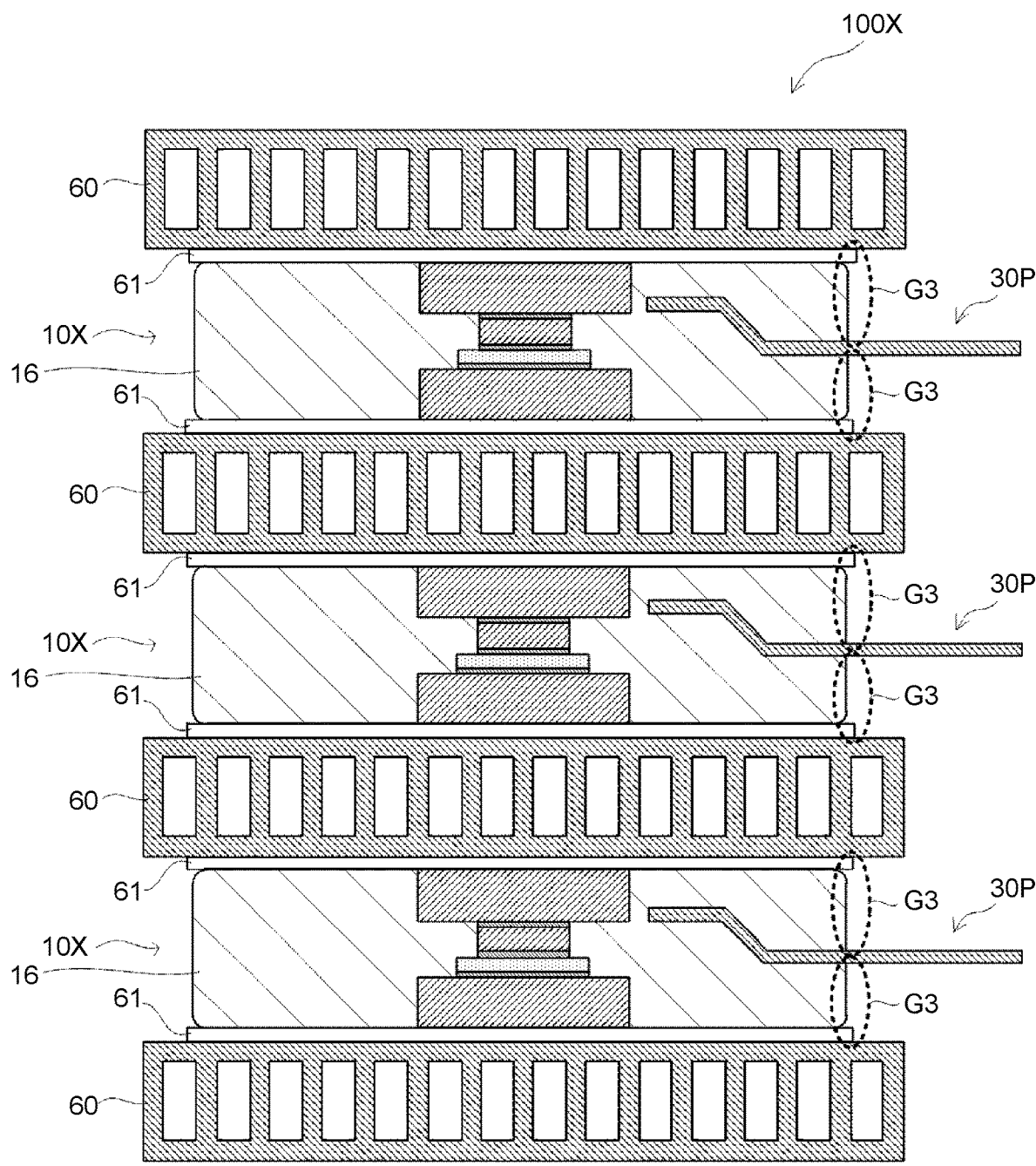
FIG. 11 is a sectional view of an inverter including the power modules according to the comparative example.

FIG. 11 is a sectional view of an inverter 100X formed by alternately stacking the power modules 10X according to the comparative example and the coolers 60. In the power module 10X according to the comparative example, not only creeping discharge between the electrical terminals 30XP, 30XN, 30XO but also creeping discharge along the surfaces of the mold resin 16 and the insulating plates 61 tends to occur in regions G3 between these electrical terminals and the coolers 60.

In the power module 10 according to the embodiment of the present disclosure, the cross-sections of the first parts 32a, disposed on the side of the mold resin 16, of the protruding sections 32 of the electrical terminals 30P, 30N, 30O protruding from the mold resin 16 have a circular shape as shown in FIG. 4A. The first part 32a having such a smooth curved shape without an edge can alleviate the concentration of electrical field in side surface areas between the electrical terminals 30P, 30N and between the electrical terminals 30N, 30O. Accordingly, partial discharge (generation of initial electrons that is a starting point of discharge) is suppressed, and as a result, creeping discharge is suppressed. Thus, insulation performance between the electrical terminals can be enhanced in the power module 10 according to the embodiment of the present disclosure. In particular, the first part 32a of the protruding section 32 having a circular cross-sectional shape can efficiently suppress a non-uniform electrical field and promote the insulation performance improving effect. With the improved insulation performance between the electrical terminals, the power module 10 according to the embodiment requires a shorter distance between the electrical terminals for securing insulation between the terminals than conventional power modules. Accordingly, the power module 10 can be made more compact than conventional power modules.

Also when the plurality of power modules 10 is stacked with the cooler 60 sandwiched in between as shown in FIG. 7, creeping discharge occurring along the surfaces of the mold resin 16 and the insulating plates 61 between the electrical terminals 30P, 30N, 30O and the coolers 60 can be suppressed. Thus, the insulation performance not only between the electrical terminals 30P, 30N, 30O but also between these electrical terminals and the coolers 60 can be improved in the power module 10 according to the embodiment.

In the power module 10 according to the embodiment, the second parts 32b disposed on the leading end side of the protruding sections 32 of the electrical terminals 30P, 30N, 30O have a flat plate shape. The electrical terminals 30P, 30N, 30O are expected to be connected to an external device, such as a motor, through a flat plate-shaped busbar (not shown). If the protruding sections 32 of the electrical terminals 30P, 30N, 30O are formed only by a columnar part, an area of contact between the flat plate-shaped busbar and the columnar electrical terminal cannot be secured, so that the contact resistance increases. Since a high current flows through the electrical terminals 30P, 30N, 30O, a higher contact resistance incurs a larger loss. For this reason, the flat plate-shaped second parts 32b are provided on the leading end side of the protruding sections 32 of the electrical terminals 30P, 30N, 30O, so as to connect the electrical terminals 30P, 30N, 30O and the busbar to each other at the second parts 32b. Thus, a large area of contact between the electrical terminals 30P, 30N, 30O and the busbar can be secured, so that an increase in the contact resistance can be avoided.

Thus, in the power module 10 according to the embodiment, the first parts 32a disposed on the mold resin side (base side) of the protruding sections 32 of the electrical terminals 30P, 30N, 30O have such a smooth curved shape as can suppress creeping discharge (partial discharge), while the second parts 32b disposed on the leading end side of the protruding sections 32 that are not involved in creeping discharge have a flat plate shape suitable for electrical connection with a busbar.

In the power module 10 according to the embodiment, the area of the cross-section of the first part 32a of the protruding section 32 of each of the electrical terminals 30P, 30N, 30O orthogonal to the protrusion direction (the cross-section shown in FIG. 4A) and the area of the cross-section of the second part 32b of the protruding section 32 orthogonal to the protrusion direction (the cross-section shown in FIG. 4B) are equal. To pass a high current through the electrical terminals 30P, 30N, 30O, each electrical terminal needs to have a predetermined or larger cross-sectional area. When the cross-sectional areas of the first part 32a and the second part 32b of the protruding section 32 are set to be equal, a required cross-sectional area can be secured along the entire electrical terminals 30P, 30N, 30O.

Figure 12A:
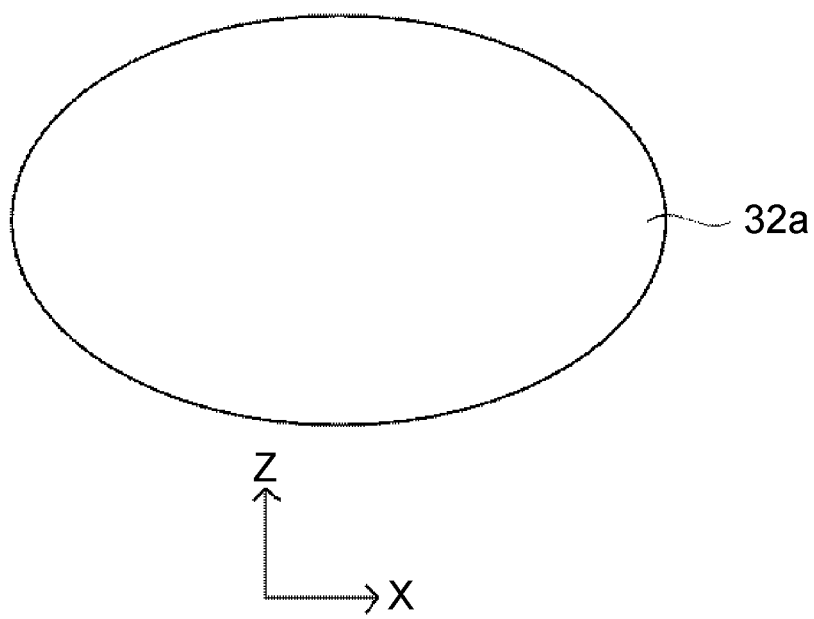
FIG. 12A is a sectional view showing another example of the cross-sectional shape of a first part of a protruding section of the electrical terminal according to the embodiment of the present disclosure.
Figure 12B:
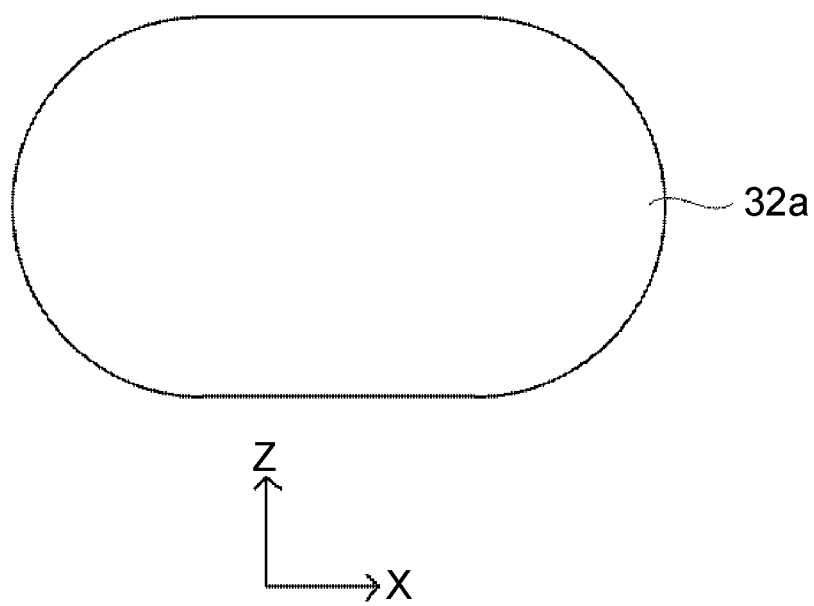
FIG. 12B is a sectional view showing another example of the cross-sectional shape of the first part of the protruding section of the electrical terminal according to the embodiment of the present disclosure.

In the embodiment, the case where the cross-section of the first part 32a of the protruding section 32 orthogonal to the protrusion direction has a circular shape has been illustrated, but the first part 32a is not limited to this aspect. For example, the cross-section of the first part 32a of the protruding section 32 orthogonal to the protrusion direction may have an oval shape as shown in FIG. 12A and FIG. 12B. An oval shape includes an elliptical shape as shown in FIG. 12A, a so-called oblong shape as shown in FIG. 12B, and similar shapes. An oblong shape refers to a shape formed by connecting two semicircles of the same radius through external common tangents. Also when the cross-section of the first part 32a of the protruding section 32 orthogonal to the protrusion direction has an oval shape, creeping discharge occurring between the electrical terminals as well as creeping discharge occurring between the electrical terminals and the coolers can be suppressed.

Figure 13:
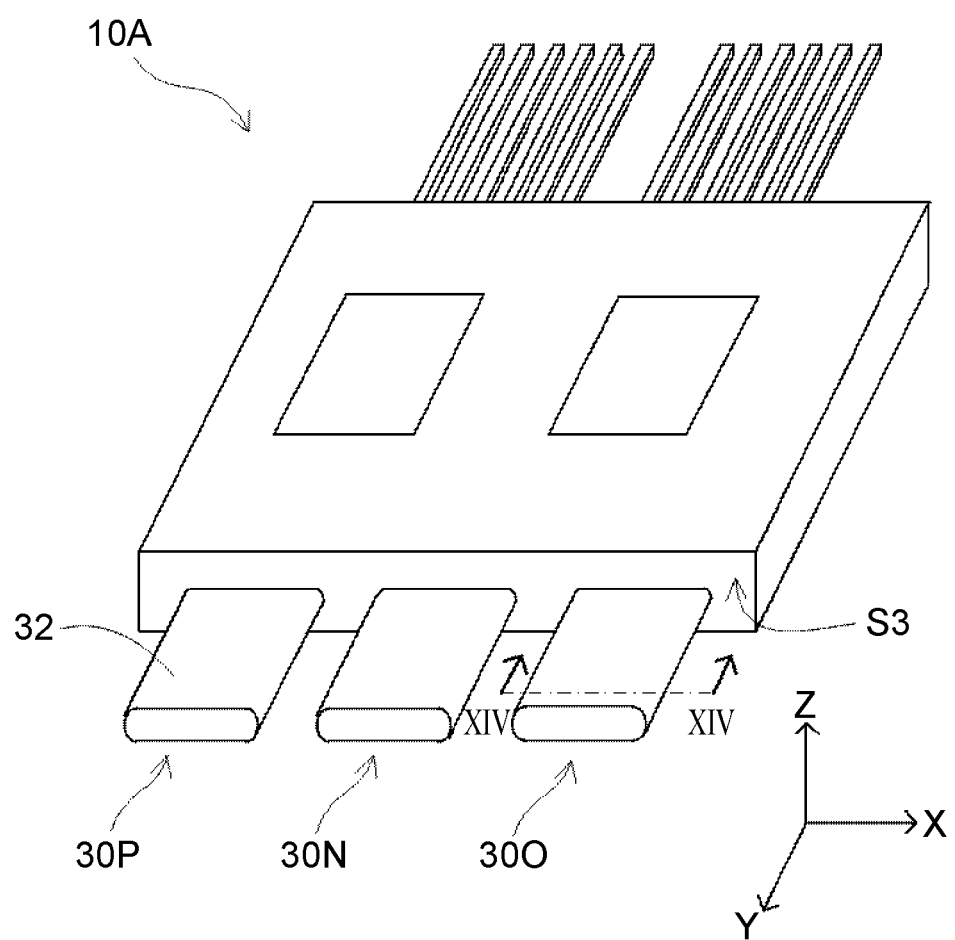
FIG. 13 is a perspective view showing the configuration of a power module according to another embodiment of the present disclosure.

FIG. 13 is a perspective view showing the configuration of a power module 10A according to a second embodiment of the present disclosure. FIG. 14 is a sectional view taken along line XIV-XIV in FIG. 13. The power module 10A is different from the power module 10 according to the first embodiment in the shape of the electrical terminals 30P, 30N, 30O. Specifically, the cross-sections of the protruding sections 32 of the electrical terminals 30P, 30N, 30O of the power module 10A orthogonal to the protrusion direction (Y-direction) (the cross-sections thereof parallel to the X-Z plane) have an oblong shape as shown in FIG. 14. More specifically, end surfaces of the protruding sections 32 of the electrical terminals 30P, 30N, 30O in the terminal array direction (X-direction) are curved surfaces having a curvature corresponding to the reciprocal of half a thickness T of the protruding section 32 in a plate thickness direction (Z-direction) orthogonal to the terminal array direction (X-direction) (2/T). In other words, as seen in the cross-section shown in FIG. 14, each end of the protruding section 32 in the terminal array direction (X-direction) has a semicircular shape with a radius of T/2. This is a shape that requires a minimum amount of processing.

The electrical terminals 30P, 30N, 30O having the shape shown in FIG. 13 and FIG. 14 can alleviate the concentration of electrical field in the side surface areas between the electrical terminals 30P, 30N and between the electrical terminals 30N, 30O. As a result, creeping discharge occurring between the electrical terminals is suppressed, and the insulation performance between the electrical terminals can be enhanced. Also when the plurality of power modules 10 is stacked with the cooler 60 sandwiched in between as shown in FIG. 7, creeping discharge occurring between the electrical terminals 30P, 30N, 30O and the coolers 60 can be suppressed. Thus, the insulation performance not only between the electrical terminals 30P, 30N, 30O but also between these electrical terminals and the coolers 60 can be improved in the power module 10A according to this embodiment, as in the power module 10 according to the first embodiment.

FIG. 15 is a graph showing an electrical field distribution between the electrical terminals (in regions corresponding to the regions G1, G2 shown in FIG. 10) in the power module 10A according to the second embodiment of the present disclosure and in the power module 10X according to the comparative example (see FIG. 10). In the graph shown in FIG. 15, the vertical axis shows electrical field intensity, and a horizontal axis shows a position in the terminal array direction (X-direction), with a right end of the electrical terminal 30P taken as a zero point for the position in the X-direction. In the graph shown in FIG. 15, the solid lines correspond to the power module 10A according to the second embodiment of the present disclosure, and the dashed lines correspond to the power module 10X according to the comparative example.

As shown in FIG. 15, the electrical field intensity near the electrical terminals can be made lower in the power module 10A according to the second embodiment of the present disclosure than in the power module 10X according to the comparative example. This means that the power module 10A can alleviate the concentration of electrical field near the electrical terminals and thereby suppress partial discharge.

Since the protruding sections 32 of the electrical terminals 30P, 30N, 30O have flat surfaces, the power module 10A according to the second embodiment of the present disclosure can secure an area of contact with a busbar. Thus, there is no need for forming the base side and the leading end side of the protruding section 32 into different shapes as in the power module 10 according to the first embodiment.

In the power module 10A according to the second embodiment of the present disclosure, therefore, concentration of electrical field in the side surface areas formed between the electrical terminals and in the side surface areas between each electrical terminal and the cooler can be alleviated, simply by performing a minimum amount of processing of processing the end surfaces of the electrical terminals 30P, 30N, 30O in the terminal array direction (X-direction). Thus, the distance between the electrical terminals required to secure insulation between the terminals can be reduced compared with conventional power modules, and the power module 10 can be made more compact than conventional power modules.

The shape of the protruding sections 32 of the electrical terminals in the power module 10A according to the second embodiment of the present disclosure can be adopted as the shape of the first parts 32a of the protruding sections 32 of the electrical terminals of the power module 10 according to the first embodiment.

What is claimed is:

1. A semiconductor device comprising:
   at least one power semiconductor element;
   a sealing resin disposed so as to seal the power semiconductor element; and
   a plurality of electrical terminals each electrically connected to the power semiconductor element and each including a protrusion protruding from a surface of the sealing resin, wherein
   the protrusion includes a first part that is provided on a side of the sealing resin in a protrusion direction of the protrusion and of which a cross-section intersecting the protrusion direction has one of a circular shape and an oval shape,
   the protrusion includes a second part having a flat plate shape, and the second part is provided on a side of a leading end of the first part in the protrusion direction, and
   the second part is disposed at an outermost part of the protrusion.

2. The semiconductor device according to claim 1, wherein end surfaces of the first part in a terminal array direction in which the electrical terminals are arrayed are curved surfaces having a curvature corresponding to the reciprocal of half a length of the first part in a direction intersecting the terminal array direction.

3. The semiconductor device according to claim 1, wherein
   the power semiconductor elements include a first transistor and a second transistor,
   the electrical terminals include
   a first electrical terminal connected to a collector of the first transistor,
   a second electrical terminal connected to an emitter of the second transistor, and
   a third electrical terminal connected to an emitter of the first transistor and a collector of the second transistor.

4. A power converter comprising: a plurality of semiconductor devices stacked with a cooler sandwiched in between, each of the semiconductor devices including:
   at least one power semiconductor element;
   a sealing resin disposed so as to seal the power semiconductor element; and
   a plurality of electrical terminals each electrically connected to the power semiconductor element and each having a protrusion protruding from a surface of the sealing resin, wherein the protrusion includes:
   a first part that is provided on a side of the sealing resin in a protrusion direction of the protrusion and of which a cross-section intersecting the protrusion direction has one of a circular shape and an oval shape,
   a second part that has a flat plate shape and is provided on a side of a leading end of the first part in the protrusion direction, and
   the second part is disposed at an outermost part of the protrusion.

5. A semiconductor device comprising:
   at least one power semiconductor element;
   a sealing resin disposed so as to seal the power semiconductor element; and
   a plurality of electrical terminals each electrically connected to the power semiconductor element and each including a protrusion protruding from a surface of the sealing resin, wherein
   the protrusion includes a first part that is provided on a side of the sealing resin in a protrusion direction of the protrusion and of which a cross-section intersecting the protrusion direction has one of a circular shape and an oval shape,
   the protrusion includes a second part having a flat plate shape, and the second part is provided on a side of a leading end of the first part in the protrusion direction,
   an area of a cross-section of the first part intersecting the protrusion direction and an area of a cross-section of the second part intersecting the protrusion direction are equal, and
   the second part is disposed at an outermost part of the protrusion.

* * * * *